United States Patent [19]

Jambotkar

[11] 4,055,884
[45] Nov. 1, 1977

[54] FABRICATION OF POWER FIELD EFFECT TRANSISTORS AND THE RESULTING STRUCTURES

[75] Inventor: Chakrapani Gajanan Jambotkar, Hopewell Junction, N.Y.

[73] Assignee: International Business Machines Corporation, Armonk, N.Y.

[21] Appl. No.: 750,053

[22] Filed: Dec. 13, 1976

[51] Int. Cl.$^2$ .............................................. B01J 17/00
[52] U.S. Cl. .......................................... 29/571; 29/578
[58] Field of Search .................... 29/571, 578; 357/13, 357/23

[56] References Cited

U.S. PATENT DOCUMENTS 3,199,002  8/1965  Martin ...................................... 29/578

Primary Examiner—Gerald A. Dost
Attorney, Agent, or Firm—George O. Saile

[57] ABSTRACT

The fabrication method provides a power metal-oxide-semiconductor field-effect transistor (MOSFET) having high switching speed capabilities. The high switching speed is facilitated by narrow channel length which is defined by the difference in lateral diffusion junctions of the P substrate and N source diffusions. The high current capability is produced by the large channel width. The high voltage capability is caused by the use of FET substrate P diffusions designed to be located apart from one another by very small distances. Unbiased or floating P diffusions are designed to flank the outer peripheries of P substrate diffusions. The close proximity of the adjacent P substrate diffusions reduces the electric field in the curvature portion of the P diffusion junctions in the N− silicon body at their inner peripheries, while the presence of the unbiased P diffusions at the appropriate distance from the outer peripheries of P substrate diffusions reduces the electric field in the curvature region of the P substrate diffusions at their outer peripheries. The N silicon body forms the drain region.

11 Claims, 20 Drawing Figures

FABRICATION OF POWER FIELD EFFECT TRANSISTORS AND THE RESULTING STRUCTURES

BACKGROUND OF THE INVENTION

The invention relates to fabrication methods and resulting devices for power MOSFET structures that have high switching speed capabilities.

DESCRIPTION OF THE PRIOR ART

MOSFET devices are generally known in the semiconductor art as small-signal devices. When high current and high voltages are required such as in power applications, the bipolar type of transistor device is generally used. The MOSFET devices do have advantages over the bipolar transistors in device characteristics as well as in the fabrication processes. In the area of fabrications, MOSFET devices can be made with fewer manufacturing steps than its bipolar counterpart. The FET device is also a smaller structure than its counterpart bipolar device. In the area of device characteristics, MOSFETs do not suffer from the secondary breakdown or thermal runaway that bipolar devices do since MOSFETs have a negative temperature coefficient. Also MOSFETs have no minority-carrier storage time, so switching speeds can be much higher. The MOSFET has low gate leakage currents since it is a voltage-controlled device. Even when high currents are switched, gate leakage does not exceed a few nanoampers.

One type of MOSFET power device has been described in the Electronic Design 21, Oct. 11, 1975, pages 103, 104. This article describes a device which has substantial power and current ratings. It is a mesa-like structure which enables the realization of high drain-to-substrate reverse breakdown voltage. The method of fabrication of the device involves conventional diffusions of channel and source regions, followed by the formation of V-shaped grooves which are etched through the channel and source regions. Finally, silicon dioxide is grown over the v-grooved gate region and metallization is applied.

SUMMARY OF THE PRESENT INVENTION

In accordance with the present invention, a MOSFET device structure having high current and high voltage characteristics is described which may be much more easily and accurately fabricated than MOSFET power devices of the prior art. The MOSFET may be a P channel or N channel device. For simplicity, only, an N channel structure is described. The P channel structure simply uses opposite polarity elements to that of the N channel structure. The device has a narrow channel length which is defined by the difference in lateral diffusion junction of the P substrate and the N+ source diffusions. A large channel width is also formed between the source and the drain which gives a high current capability to the device. The small distances between the substrate P diffusions produces high voltage capability in the device. The unbiased or floating P diffusions are designed to be formed adjacent to the outer peripheries of the P substrate diffusions. The close proximity of the adjacent P substrate diffusion reduces the electric field in the curvature portion of the P diffusion junctions in the N- silicon body at their inner peripheries. The presence of the unbiased P diffusions at the appropriate distance from the outer peripheries of the P substrate diffusions reduce the electric field in the curvature region of the P substrate diffusions at their outer peripheries. The drain for the structure is formed by the N silicon ody. The drain to substrate reverse breakdown voltage is made by this structure practically equal to the maximum possible allowed by the doping of the N- drain region.

The method for manufacturing the MOS field effect transistor devices is possible by standard photolithography techniques. An N+ substrate is provided. A plurality of P regions are formed in the substrate such as by diffusion or ion implantation techniques. N+ regions are then formed in each of the inner P regions. The desired gate insulator region between the source and the drain are formed. The outer annular P regions are allowed to remain under a field insulator. Source contacts are formed to the N+regions within the inner P substrate regions. Gates are formed over the gate insulator regions. The drain region is contacted on the backside of the N+ substrate. The outer annular P regions are allowed to remain unbiased or floating to thereby improve the drain-to-substrate reverse breakdown voltage.

If depletion-mode, rather than enhancement-mode MOSFET devices are desired to be manufactured, then the depletion-mode MOSFET devices are obtained through formation of a blanket N skin layer at the top surface of the silicon substrate.

BRIEF DESCRIPTION OF THE DRAWINGS

FIGS. 1A–9A and FIGS. 1B–9B illustrate one form of the fabrication method of the present invention;

DESCRIPTION OF THE PREFERRED EMODIMENTS

Figure 1A:
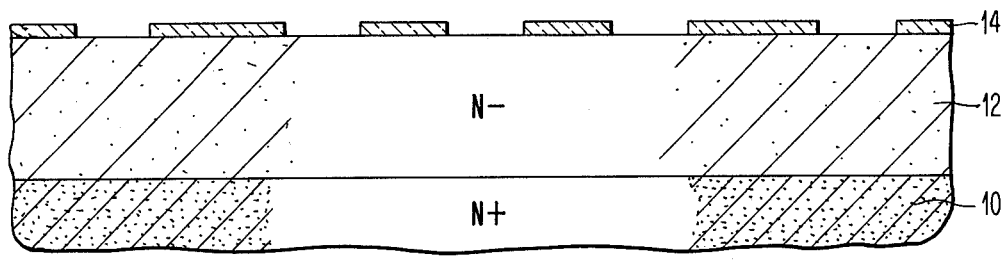
Figure 1B:
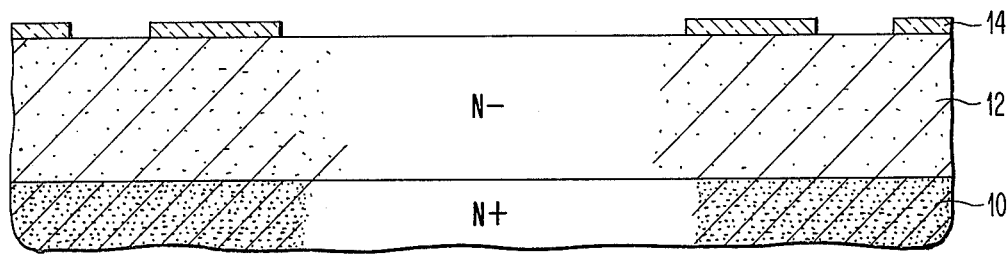

Referring now more particularly to FIGS. 1A and 1B, there is shown an N+ type semiconductor body 10. The body 10 has, for example, the resistivity of 0.001 to 0.01 ohm-centimeter. The body is preferably a monocrystalline silicon structure which was fabricated by conventional techniques such as Czochralski crystal growing from a melt containing the desired N+ impurity concentration. Semiconductor wafers are then formed by slicing the crystal into a plurality of thin wafers by a suitable cutting tool. The wafer surfaces are then polished as is conventional in the art. An n− type epitaxial silicon layer 12 is then grown onto the substrate body 10 by conventional epitaxial silicon growth techniques. The resistivity of the epitaxial layer is between about 5 to 50 ohm-centimeters. The epitaxial N− layer preferably has a thickness of within 10 to 80 micro-meters and preferably about 50 micrometers.

A thin layer of silicon dioxide 14 of the order of 2000 to 5000 Angstroms and preferably 4000 Angstroms in thickness is formed over the surface of the epitaxial layer. It is preferable to grow layer 14 by the thermal method utilizing a typical temperature of 970° C in wet oxygen. The layer may be alternately formed by pyrolytic deposition or sputtering. Insulating layers alternate to silicon dioxide may of course be utilized. For example, aluminum oxide, silicon nitride, and combinations of these several insulating materials may be used as the alternative for the silicon dioxide insulator 14. Openings are then formed in the insulator layer 14 by conventional photolithography techniques which include application of photoresist and selective etching processes to form the openings to the surface of the epitaxial layer 12.

Figure 2A:
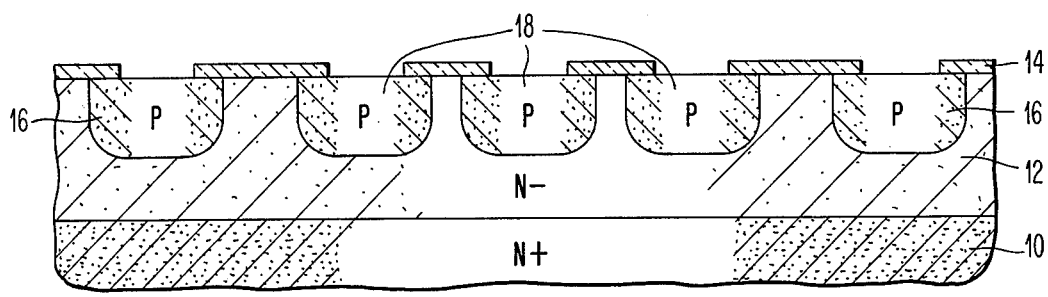
Figure 2B:
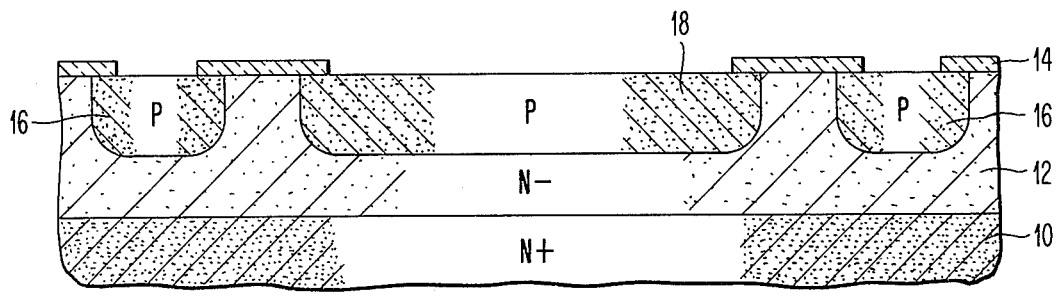

The structure as illustrated in FIGS. 1A and 1B is now positioned in a suitable diffusion chamber, or preferably an ion implantation chamber, to form the P regions 16 and 18 as illustrated in FIGS. 2A and 2B. The preferred P type impurity is boron and the preferred doping level at the silicon surface is between about $8 \times 10^{15}$ to $1 \times 10^{18}$ atoms/cc at the end of all wafer processing. Two types of P regions are formed. The substrate or inner regions 18 are placed closely spaced while the other unbiased annular P regions 16 are at a somewhat greater distance between one another and between the outer periphery of the P substrate regions 18 and inner periphery of the innermost unbiased annular P region 16.

Figure 3A:
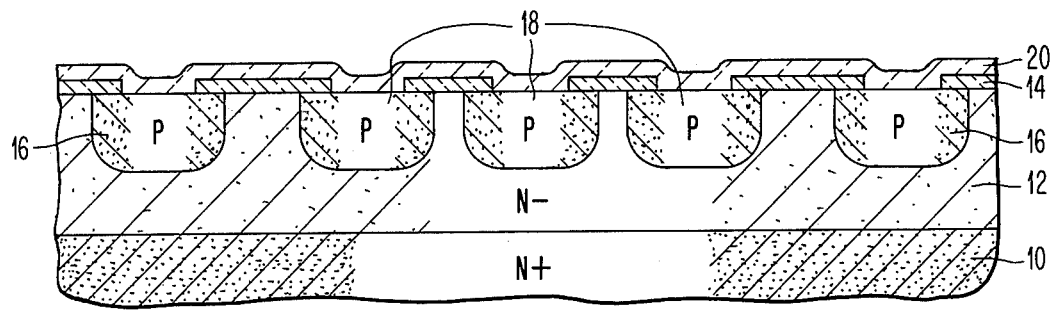
Figure 3B:
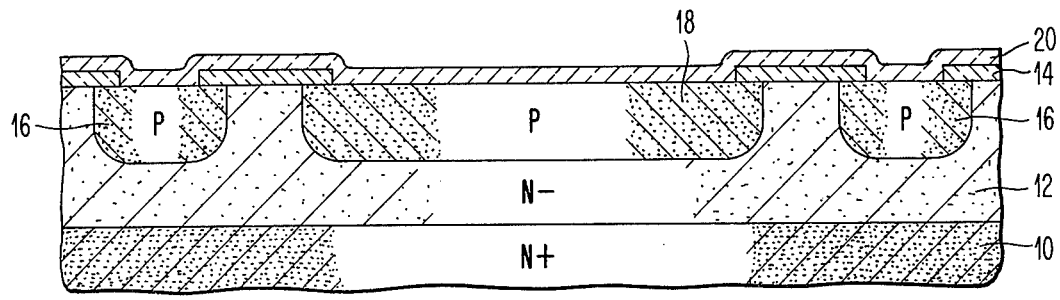

A second and different insulating layer 20 is deposited onto the surface of the structure to form the structure of FIGS. 3A and 3B. The preferred material is silicon nitride having a thickness of between about 1000 to 4000 Angstroms and preferably about 2000 Angstroms in thickness. Silicon nitride may be deposited by any of the conventional techniques such as chemical vapor deposition and sputtering. It is preferred to be deposited by chemical vapor deposition using the following reaction.

Figure 4A:
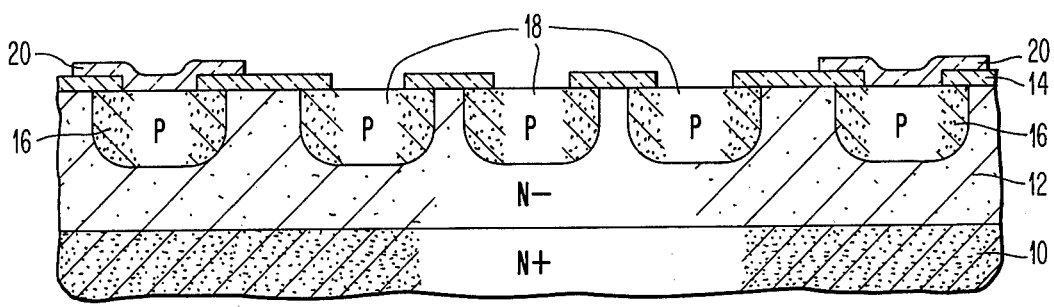

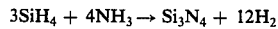

$$3SiH_4 + 4NH_3 \rightarrow Si_3N_4 + 12H_2$$

at a temperature of about 800° C. A photoresist layer (not shown) is deposited over the surface of the insulating layer 20, exposed and developed by the conventional photolithography techniques so as to mask all areas but those appropriate to be etched away. The technique of reactive ion etching preferably using $CF_4$ is then utilized to remove all silicon nitride layer 20 except that shown in FIGS. 4A and 4B which is over a small portion of the inner P substrate diffusion regions 18 and over all of the outer annular P regions 16. The photoresist layer is then removed. Alternatively, for etching the silicon nitride layer 20 selectively, a pyrolytic silicon dioxide layer (not shown) of about 1000 Angstroms may be deposited just prior to the deposition of the photoresist layer. The photoresist is exposed and developed. The pyrolytic silicon dioxide layer is then selectively etched using buffered hydrofluoric acid. The photoresist is removed and the silicon nitride layer not beneath the pyrolytic silicon dioxide layer is etched using hot phosphoric acid.

Figure 5A:
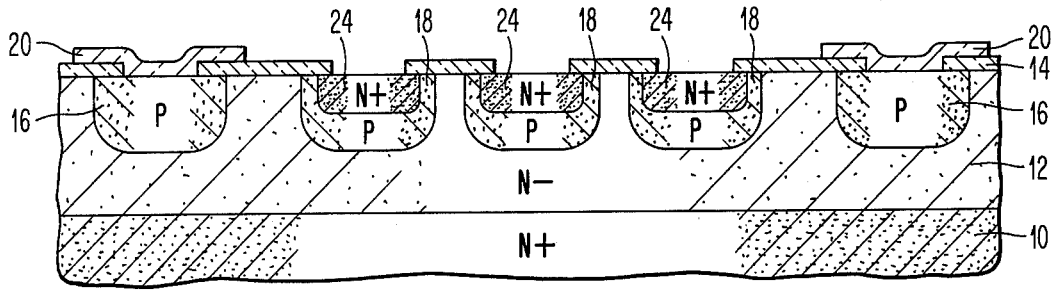
Figure 4B:
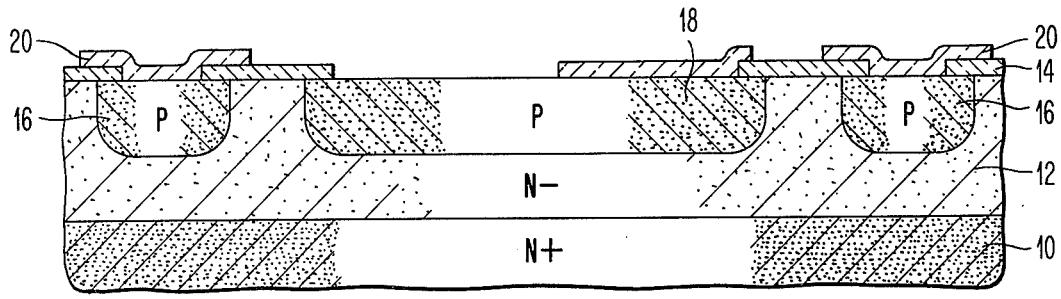
Figure 5B:
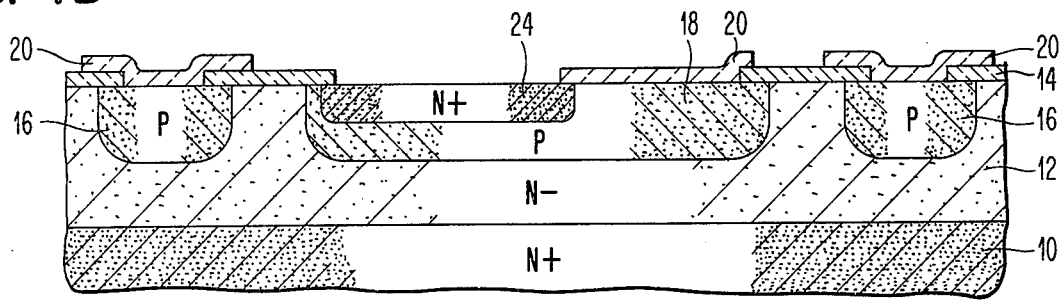

N+ type impurity region 24 is then formed in the P regions that are free of insulating layer by either diffusion or ion implantation techniques. This deposition into the silicon mostly takes place through the same silicon dioxide layer 14 openings through which the P type impurity was deposited. In the inner P substrate regions 18, the silicon dioxide insulator 14 opening is modified with the silicon nitride insulating layer 20 as shown in FIG. 4B. This modification is only for an extremely small portion of the periphery of region 18. The result of the diffusion in the P regions 18 was the N+ regions 24 as shown in FIGS. 5A and 5B. The silicon nitride layer 20, shown in FIG. 5B, protects the region where a contact will subsequently be made to the MOSFET substrate P diffusions. In this region, the opening for the N+ diffusion resulting in diffused region 24 is smaller than the remainder of the substrate P diffusions. The outer annular P regions 16 do not receive an N+ diffusion since regions 16 are protected by layer 20 as shown in FIG. 5A.

All silicon nitride layer 20 is now removed using hot phosphoric acid. If a pyrolytic layer of silicon dioxide had been deposited above the silicon nitride layer 20 in the alternate manner described above, then the pyrolytic silicon dioxide layer is removed, of course, before removing the silicon nitride layer.

Figure 6A:
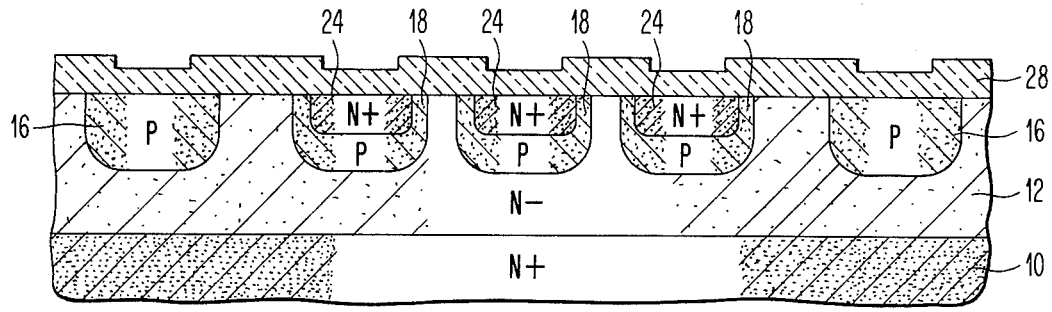
Figure 6B:
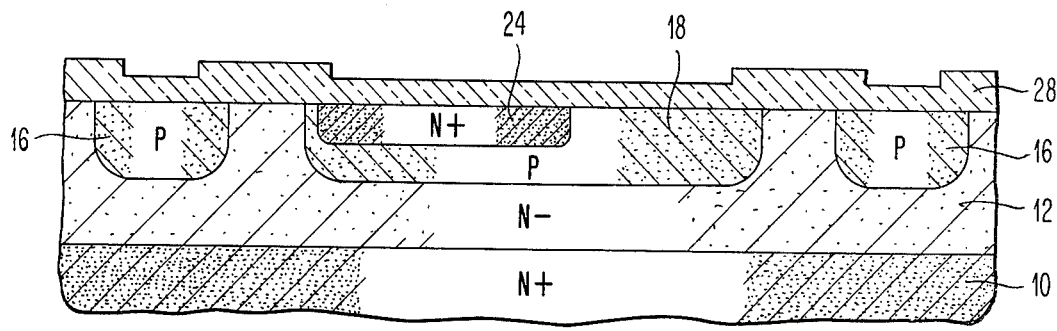

Thermally grown silicon dioxide is now formed over the exposed silicon regions to form the structure of FIGS. 6A and 6B. The entire oxide layer is designated as 28. It is preferred that approximately 3000 Angstroms of silicon dioxide is grown at this time by the use of wet oxygen at 970° C. for a suitable time. Simultaneously with the growth of the thermal silicon dioxide there is a drive-in of P and N+40 impurities to the desired junction depths of for the P region between about 2 to 7 micrometers and for the N+ region of between about 1 to 4 micrometers. The preferred junction depth for the P region is about 3.5 micrometers and the N+ region 1.5 micrometers.

Figure 7A:
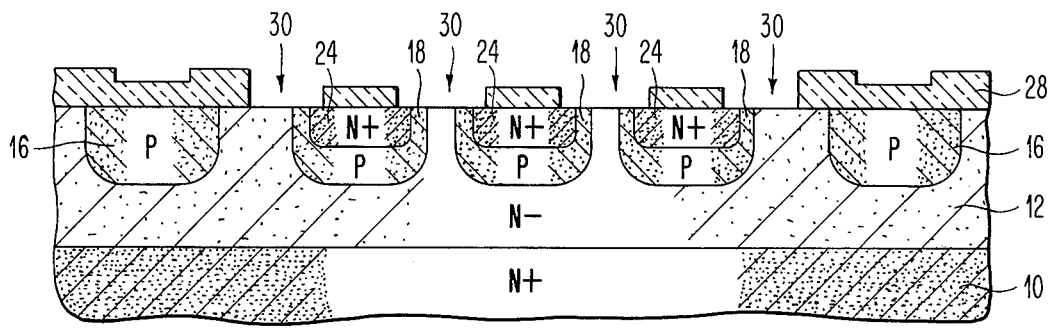
Figure 8A:
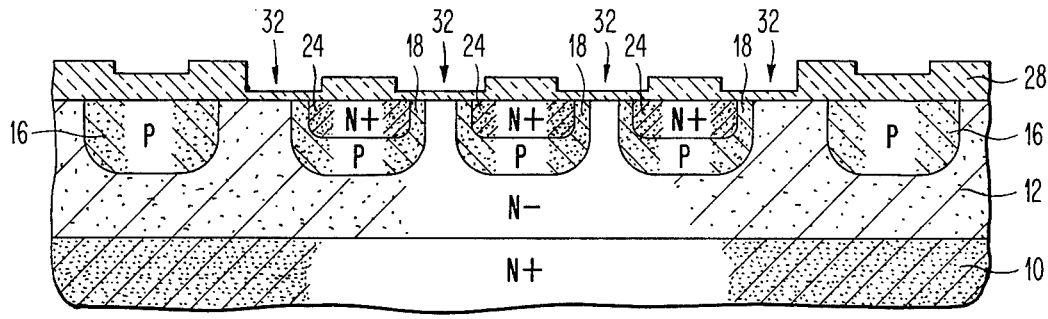
Figure 9A:
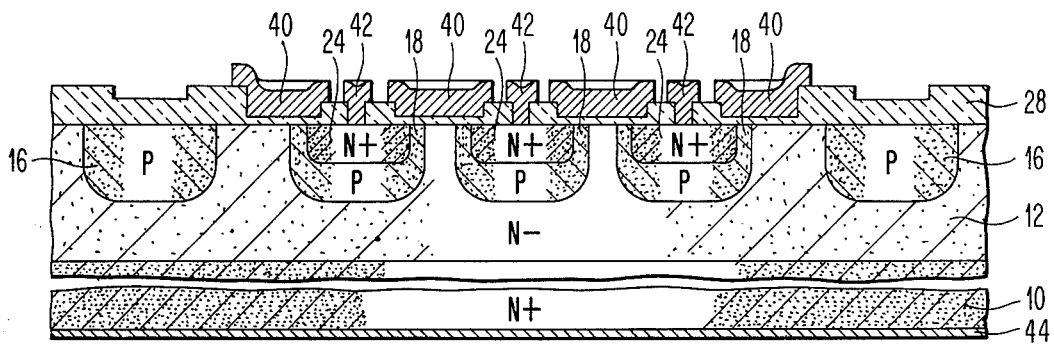
Figure 7B:
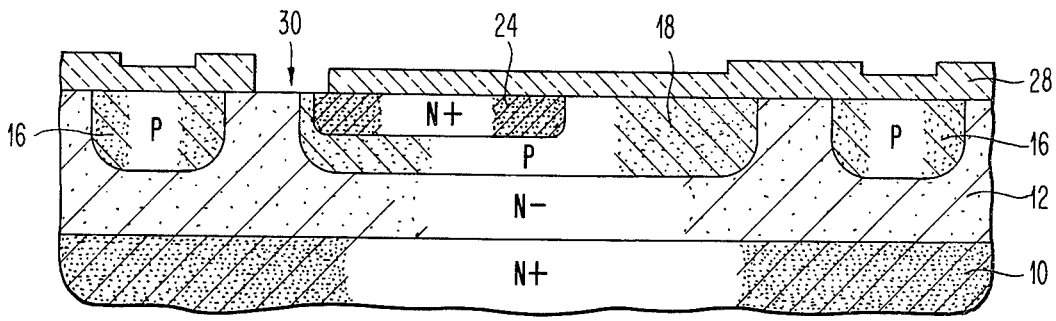
Figure 8B:
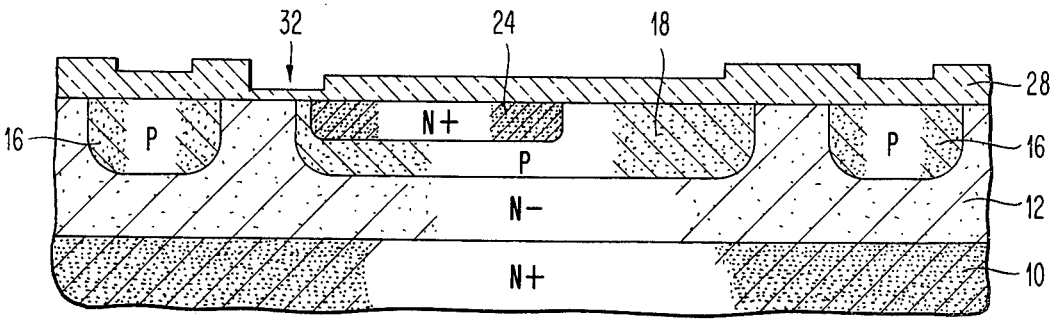

The gate insulator is now formed. This is accomplished by selectively etching the silicon dioxide regions by standard photolithography and selective etching techniques to produce the structure of FIGS. 7A and 7B. It is seen that the openings 30 are made in the areas where the gate insulator is to be formed. The next step is to thermally grow silicon dioxide or obtain other suitable insulator which could be a combination of silicon dioxide and silicon nitride for example to a desired thickness. The exact thickness depends upon the threshold voltage and transconductance requirement of the power device being manufactured. The gate insulator is between about 500 to 5000 Angstroms and preferably about 1000 Angstroms. It is also preferred to be of pure silicon dioxide. The resulting structure is shown in FIGS. 8A and 8B where the gate insulators are 32.

Figure 9B:
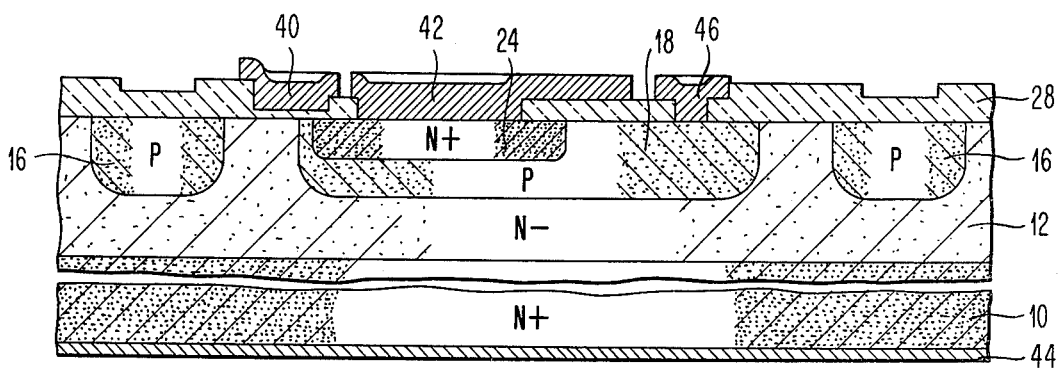

Photoresist is then applied to the surface of the device and suitable photolithographic and etching steps are utilized to form openings in the oxide layer 28 for the source contacts and the P substrate region contacts. The outer annular P regions 16 are left floating or unbiased and are not electrically contacted. The photoresist is then removed and a blanket layer of metal such as aluminum is evaporated over onto the entire surface of the structure. The thickness of the metal is between about 0.8 to 4 micrometers and preferably 1.5 micrometers. The aluminum is deposited both on the frontside and the backside of the semiconductor wafer. Through the standard photolithography and selective etching techniques, patterns are formed in the aluminum layer on the frontside of the semiconductor wafer to form the desired electrical connections for the source, the gate and the substrate. The metal is then annealed for approximately 20 to 30 minutes at 400° C in forming gas or nitrogen. The gate electrodes are 40, the source electrodes are 42 and the common drain electrode at the backslide of the wafer is 44. The substrate P region electrode is 46 and is shown in FIG. 9B.

Subsequent to the illustrated steps, passivation with sputtered silicon dioxide, silicon nitride, various glasses or other passivating materials may be formed by sputtering, chemical vapor deposition or other suitable techniques. Electrical contacts using for example, wire bonding may be made through the passivation layers to the device. The device is then packaged on a module by the standard packaging techniques.

Figure 10:
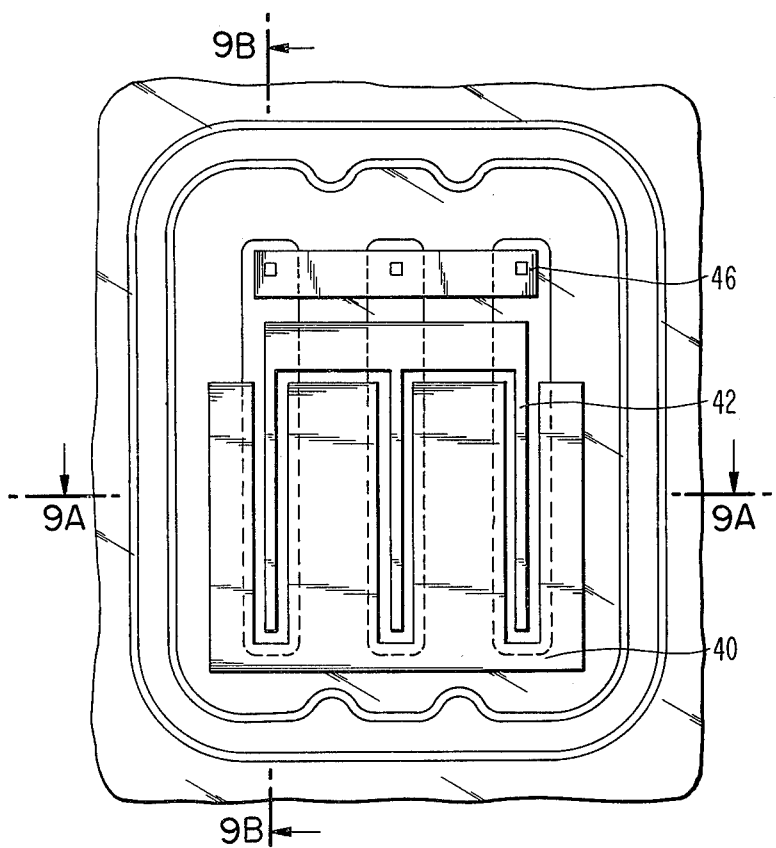
FIG. 10 illustrates a planar top view of the structure resulting from the fabrication method illustrated by FIGS. 1A–9A and FIGS. 1B–9B.
Figure 11:
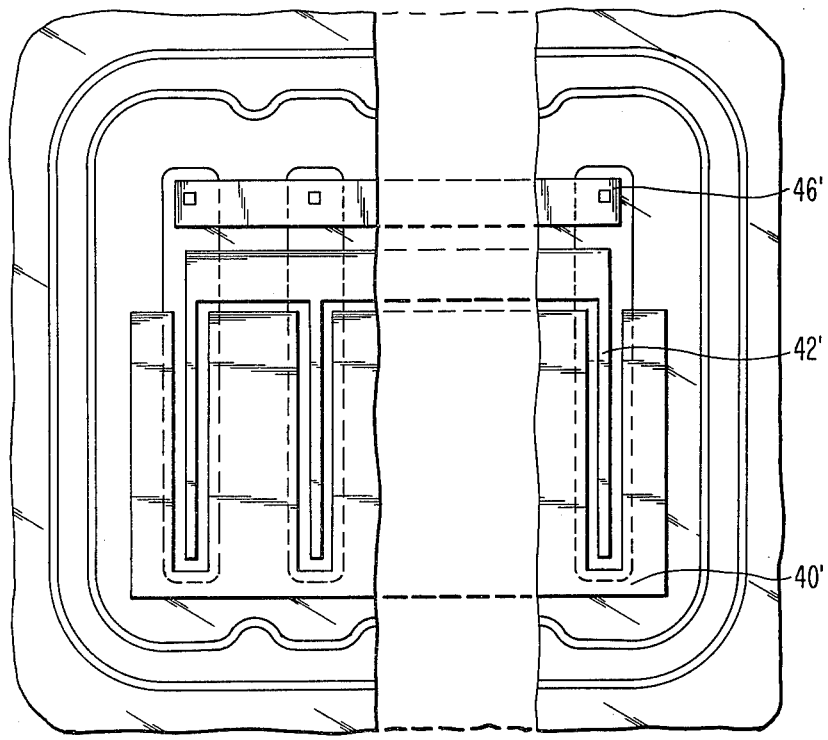
FIG. 11 illustrates the structure of a different MOSFET power device.

A plane view of the structure resulting from the process is shown in FIG. 10. FIG. 11 shows a similar structure with a broken segment 50 which points up the fact that a plurality of the N+ sources, P substrates and gates may be utilized to form the desired power MOSFET device structure of the present invention. Like structures to the FIG. 10 embodiment are shown by a prime (') in FIG. 11.

In the embodiments of FIGS. 10 and 11, facility is shown for applying an external voltage to the P substrate regions at electrodes 46 and 46' respectively. If, however, a MOSFET device is desired such that the P sustrate regions are premanently shortcircuited to the N+ source regions, this can, of course, be easily achieved by not separating the source and substrate electrodes 42 and 46 in FIG. 10 (42' and 46' in FIG. 11).

Also, in the illustrations of FIGS. 10 and 11, only one outer unbiased annular P region is shown for improving the drain-to-substrate reverse breakdown voltage through reduction of electric field at the curvature of the outer periphery of the P substrate regions. The vicinity of the adjacent inner peripheries of the P substrate regions reduces electric field near the curvatures of the inner peripheries of the P substrate regions. If necessary, however, additional one or more outer annular P regions may be formed, located suitably apart, to reduce the electric field at the outer periphery of the annular P regions, and thereby further improve the drain-to-substrate reverse breakdown voltage.

The high switching speed capability of the power MOSFET as described above is facilitated by the narrow channel length of between about 1 to 5 micrometers and preferably about 2 micrometers. This channel is defined by the difference in the lateral diffusion junctions of the P substrate diffusions and the N+ source diffusions. The high current capability of the device is facilitated by the large channel width which is shown in the FIGS. 10 and 11. The FET substrate P diffusions are designed to be located apart from one another by very small distances, preferably between 4 to 10 micrometers. Further, unbiased or floating annular P diffusions are also designed to flank the outer peripheries of the P substrate diffusions 18. These P regions 16 are located preferably between about 20 to 50 micrometers apart. The close proximity of the adjacent substrate diffusions 18 reduces the electric field in the curvature regions of the inner peripheries of these P diffusion/N− body junctions, while the presence of the unbiased P diffusions 16 at the appropriate distance from the outer peripheries of the P substrate diffusions 18 reduces the electric field in the curvature region of the outer peripheries of those outer P substrate diffusions 18. As a consequence, the drain to substrate breakdown voltage is made practically equal to the maximum possible value which is the plane P to N− junction reverse breakdown value.

The embodiments of FIGS. 1A-9A and 1B-9B show the formation of enhancement-mode MOSFET structures. However, if depletion-mode MOSFET structures are desired to be manufactured, they can be obtained by the formation of a blanket N skin layer of doping level preferably between $5 \times 10^{16}$ to $5 \times 10^{18}$ atoms/cc at the top surface of the silicon wafer. This blanket N skin layer is preferably obtained through unmasked ion implantation performed either just prior to or immediately after the formation of the gate insulators 32 shown in FIGS. 8A-8B. When the doping level of the N skin layer is chosen properly higher relative to the surface doping level of the P substrates regions 18, depletion-mode MOSFET devices of desired threshold voltage characteristic are obtained.

The embodiments described above and in FIGS. 1-11 are directed to N channel devices. The principles described herein are also applicable to P channel devices. The P channel structures are identical to the N channel structures of FIGS. 1-11 except for the requirement of a complete reversal of polarity, that is where an N region is listed in the drawings a P region is substituted and where a P region is listed an N region is substituted.

While the invention has been particularly shown and described with reference to the preferred embodiments thereof, it will be understood by those skilled in the art that various changes in form and details may be made therein without departing from the spirit and scope of the invention.

What is claimed is:

1. Method for fabrication of MOSFET devices having high current and high voltage characteristics comprising:
   providing an N substrate;
   forming a plurality of P regions in said substrate;
   forming N regions in said P regions;
   forming precise and desired gate insulator regions above peripheries of inner said P regions while allowing outermost annular P regions to remain under a blanket fieled insulator;
   forming source contacts to the N regions within said inner P regions, forming gates over the said gate insulator regions, and forming the common drain region contact on the backside of the N+ substrate; and
   allowing the said outermost annular P regions to remain unbiased to thereby improve the drain-to-substrate reverse breakdown voltage.

2. The method of claim 1 wherein said substrate in in part an epitaxial layer and said P and N regions are formed in said epitaxial layer.

3. The method of claim 2 wherein said epitaxial layer is N− and the remaining portion of said substrate in N+.

4. The method of claim 1 wherein the said P regions were formed by diffusion through openings in an insulator layer, a second insulator layer formed thereafter and made to cover the portion of said openings that will partly become said substrate contacts, and said N regions formed by diffusion through the said openings in said insulator layer as modified by said second insulator films.

5. The method of claim 4 wherein the said insulator layer is silicon dioxide, said second insulator layer is silicon nitride and a silicon dioxide film is thermally grown while simultaneously driving in said P and N regions.

6. The method of claim 4 wherein said P junction depth is between about 2 to 7 micrometers and said N junction between about 1 to 4 micrometers.

7. The method of claim 1 wherein the channel length under the said gates is between about 1 to 5 micrometers.

8. The method of claim 6 wherein the distance between pairs of said inner P regions is between about 4 to 10 micrometers.

9. The method of claim 8 wherein said outermost annular P regions have a distance between about 20 to 50 micrometers between one another and the outer peripheries of the inner P regions.

10. Method for fabrication of MOSFET devices having high current and high voltage characteristics comprising:
- providing a P+ substrate having a P− epitaxial layer;
- forming a plurality of N regions in said epitaxial layer;
- forming P regions in said N regions;
- forming precise and desired gate insulator regions above peripheries of inner said N regions while allowing outermost annular N regions to remain under a blanket field insulator;
- forming source contacts to the P regions within said inner N regions, forming gates over the said gate insulator regions, and forming the common drain region contact on the backside of the P+ substrate; and
- allowing the said outermost annular N regions to remain unbiased to thereby improve the drain-to-substrate reverse breakdown voltage.

11. The method of claim 10 wherein the channel length under the said gates is between about 1 to 5 micrometers and the distance between pairs of said inner N regions is between about 4 to 10 micrometers.

* * * * *